United States Patent [19]
Takeuchi et al.

[11] Patent Number: 5,939,755
[45] Date of Patent: *Aug. 17, 1999

[54] POWER IC HAVING HIGH-SIDE AND LOW-SIDE SWITCHES IN AN SOI STRUCTURE

[75] Inventors: Yoshinori Takeuchi, Yokohama; Yosuke Takagi, Hyogo-ken, both of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/655,600

[22] Filed: May 30, 1996

[30] Foreign Application Priority Data

Jun. 8, 1995 [JP] Japan ................................ 7-141580

[51] Int. Cl.$^6$ ............................ H01L 27/01; H01L 27/12; H01L 29/00
[52] U.S. Cl. .......................... 257/347; 257/350; 257/500; 257/501; 257/503; 257/508
[58] Field of Search ................................. 257/347, 350, 257/500, 501, 503, 508

[56] References Cited

U.S. PATENT DOCUMENTS 4,974,041  11/1990  Grinberg .................................. 257/347
5,306,942  4/1994  Fujii ........................................ 257/508

FOREIGN PATENT DOCUMENTS 63-65641  3/1988  Japan ..................................... 257/508

OTHER PUBLICATIONS

IEEE Transactions on electron Devices, vol. 40, No. 11, Nov. 1993, "An intelligent Power IC with Double buried-oxide layers formed by SIMOX technology" by Ohno et al., P.2074–P.2080.

Primary Examiner—Steven H. Loke
Attorney, Agent, or Firm—Oblon, Spivak, McClelland, Maier & Neustadt, P.C.

[57] ABSTRACT

A power IC having an SOI structure including at least a supporting substrate as a bottom layer, a substrate insulating film, an SOI conductive film, an SOI insulating film, and an Si film. The Si film serving as a top layer of the SOI structure is divided into a plurality of active layers by element isolation dielectric regions, and a desired semiconductor element is formed in each active layer. A total capacitance between each active layer and the supporting substrate is small and an inversion layer formed at a bottom of the active layer in the conventional SOI substrate is prevented from being induced. The power IC is constituted at least by an element A in a first active layer and an element B in a second active layer operating in association with the element A. The first active layer is electrically connected to the SOI conductive film just under the first and second active layers. A potential difference is prevented from being applied to the second active layer of the element B upon operation of the element A. With this arrangement, even if an operating voltage of the power IC is raised, independent operation of each element is retained. Furthermore, a low on-resistance of an output stage power-element is realized, and the device characteristics such as high speed operation and high conversion efficiency are provided.

30 Claims, 9 Drawing Sheets n-ACTIVE LAYER : ~0V n-ACTIVE LAYER : HIGH VOLTAGE

FIG.5A
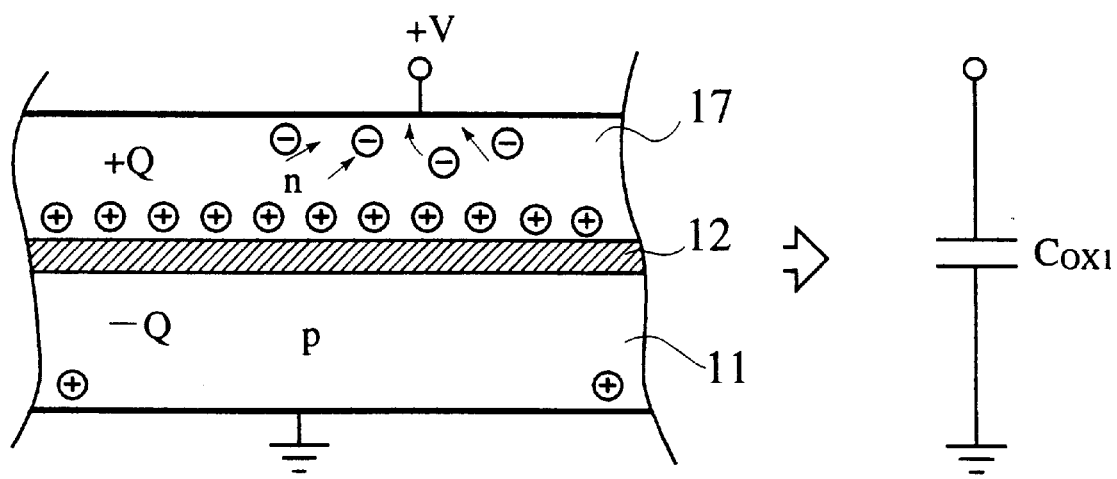
FIG.5B
FIG.6A
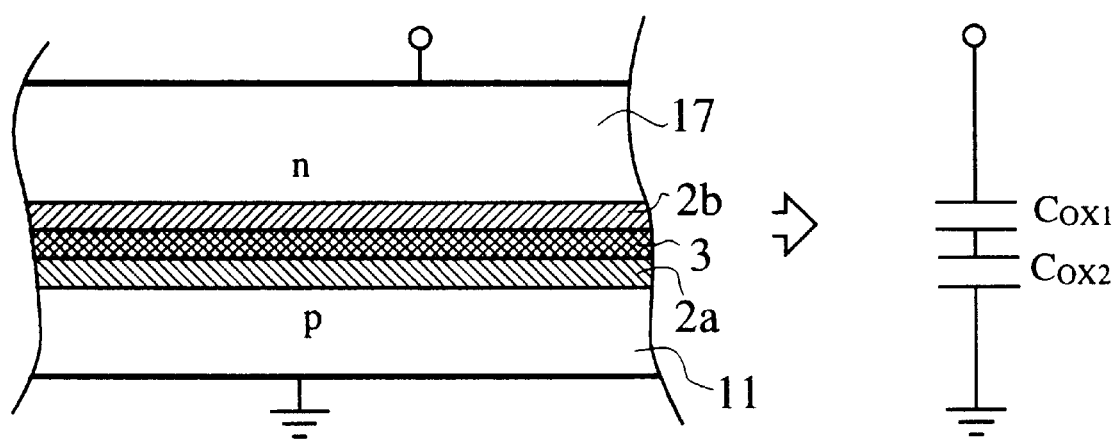
FIG.6B

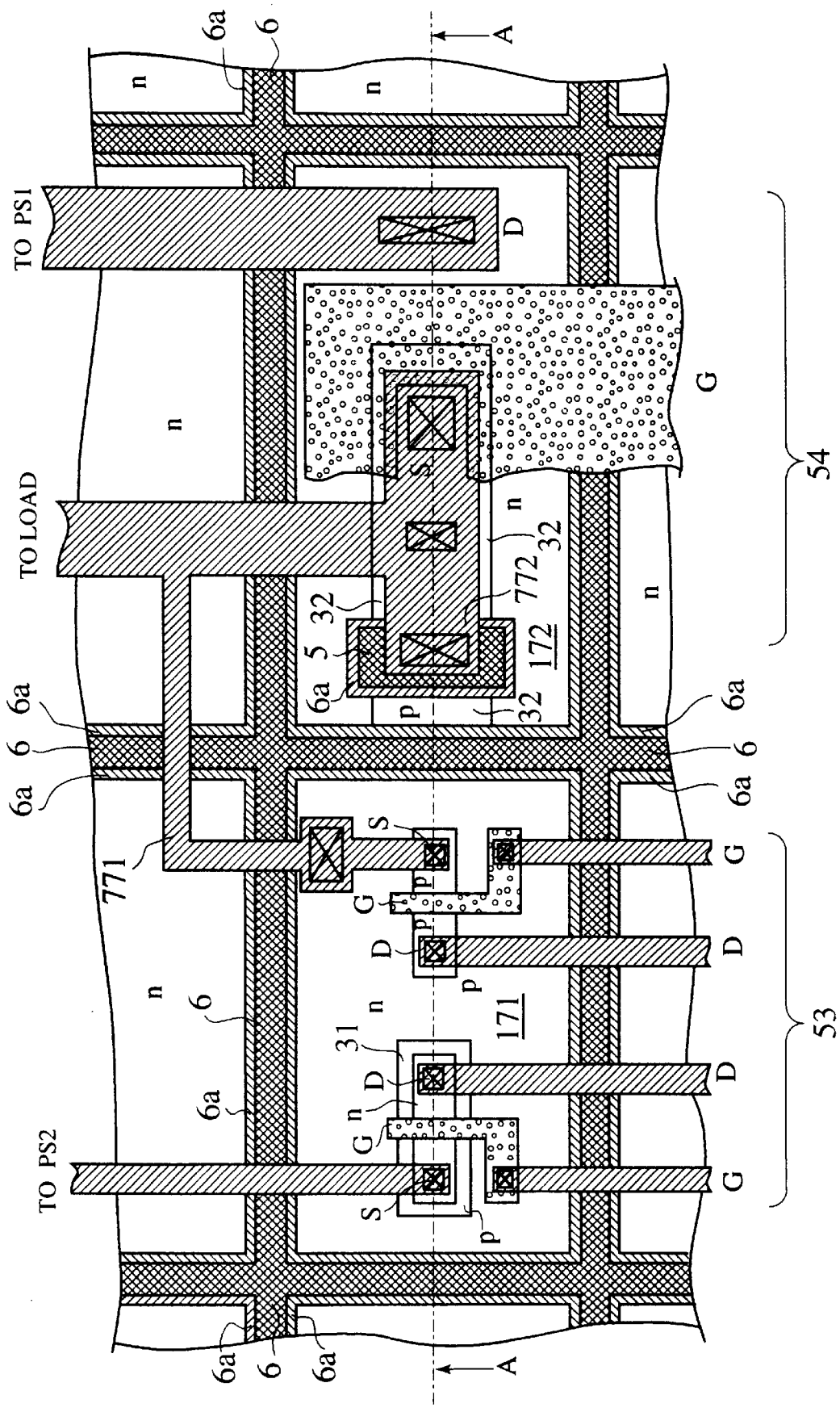

POWER IC HAVING HIGH-SIDE AND LOW-SIDE SWITCHES IN AN SOI STRUCTURE

BACKGROUND OF THE INVENTION

1. Field of the Invention

The present invention relates to a power IC including output power elements with high operating voltage or high blocking capability and their control elements or the like monolithically integrated, and more particularly to such power ICs having an SOI (Silicon On Insulator) structure.

2. Description of the Related Art

An SOI structure can easily obtain high breakdown voltage characteristics and reduce parasitic capacitance, the SOI structure having a laminate of, as shown in FIGS. 1A and 1B, a substrate (hereinafter called a supporting substrate) 1, an SOI insulating film 12, and an Si film (271, 272, 273, 274) stacked in this order from the bottom. If a thin Si film (271, 272, 273, 274) of the SOI structure is used, short channel effects of MOSFETs (MOS Field Effect Transistors) or the like formed in this thin Si film 272, 273 can be suppressed. Therefore, the SOI structure is used as one means for enhancing high integration of elements.

For power ICs having the SOI structure, the Si film (271, 272, ...) formed on the SOI insulating film 12 is, as shown in FIGS. 1A. and 1B, generally divided into a plurality of islands 271, 272, 273, ... by trench element isolation regions 6. More specifically, as shown in FIG. 2, the structure that a power-MOSFET for an output stage (hereinafter called "the output power-MOSFET") is formed in an n-type Si island 172 and a control element such as a CMOS circuit is formed in an n-type island 171, or other structures, are typical and widely used nowadays. In FIG. 2, an n-channel LDMOS (Lateral Double diffused MOS) in the island 172 is used as a high-side switch.

In order to speed up the operation of a power IC, it is necessary to raise a driving voltage of an element so as to apply a high potential difference between the electrodes in or across the elements. The SOI structure such as shown in FIG. 2 has the following deficiencies or problems to be solved in order to realize power switching element with high operating voltage or high blocking voltage.

FIGS. 3A to 3D are schematic cross sectional views of a conventional power IC with an SOI structure. With reference to FIGS. 3A to 3D, some disadvantages of this structure will be explained. FIG. 3A is a schematic cross sectional view illustrating an on-state (conducting state) of an n-channel LDMOS used as a low-side switch, and FIG. 3B is a schematic cross sectional view illustrating an on-state of the n-channel LDMOS used as a high-side switch. In FIG. 3A, an $n^+$ source region 21 of LDMOS is connected to a ground potential (GND potential), whereas in FIG. 3B, an $n^+$ drain region 23 of LDMOS is connected to a high potential power source (PS).

As shown in FIG. 3B, with LDMOS used as the high-side switch (the high-side LDMOS), an effective thickness X1' of the drift area formed in an n-type active layer 172 becomes thin and the on-resistance $R_{ON}$ of the LDMOS increases because an inversion layer 18 is formed. As compared to LDMOS used as the low-side switch (the low-side LDMOS) having an effective thickness X1 of the drift area, generally the same thickness as an n-type active layer 174, the thickness X1' of the high-side LDMOS becomes thinner than X1. The increase of the on-resistance $R_{ON}$ becomes conspicuous as the active layer 172 becomes thinner, and a substantial reduction in the thickness of the active layer results in a low operation speed of the power IC and other problems such as an increased power dissipation.

In order to change the gate potential of LDMOS so as to follow the source potential thereof, the source of a p-type MOS (pMOS) of CMOS control elements is connected to the source of LDMOS and to the n-type active layer 171 as shown in FIGS. 3C and 3D. The source of an n-type MOS (nMOS) of the CMOS control elements is connected to a power source (PS), for example, +5V. Therefore, as LDMOS changes from an off-state (nonconducting state or current blocking state) to an on-state, the source potential of LDMOS changes from a low potential to a high potential, and as shown in FIG. 3D, the n-type active layer 171 of pMOS changes from a zero potential to a positive high potential. At this time, since the supporting substrate 11 is maintained grounded, a potential difference is generated between the n-type active layer 171 and the supporting substrate 11 and an inversion layer 18 is formed in the n-type active layer 171 on the side of the SOI insulating film 12. A parasitic pnp transistor shown in FIG. 3D is therefore formed, posing a problem that latch-up is more likely to occur during the on-state (FIG. 3D) than the off-state (FIG. 3C).

In a conventional SOI power IC such as shown in FIG. 4A, if an n-type active layer 171 is thin, an inversion layer 18 (p-type conductive layer), induced in the n-type active layer 171 when the off-state of an output stage LDMOS changes to the on-state, electrically connects the two p-type conductive regions 72, 73, or the source region 72 and the drain region 73 constituting a pMOS control element as main electrode regions, and poses a problem of a leakage current.

In order to solve these problems inherent to the SOI structure, it is necessary to prevent the inversion layer 18 from being formed at the bottom of the active layer. To this end, the following two methods have been proposed conventionally.

(1) 1st Method: Changing the potential of the supporting substrate 11 so as to follow the potential of the active layer. For example, in the above example, the source potential of LDMOS is made equal to the potential of the supporting substrate 11.

(2) 2nd Method: The SOI insulating film 12 is made extraordinary thick to reduce the capacitance between the active layer and supporting substrate and correspondingly reduce the charge amount induced at the bottom of the active layer.

The first and second methods for preventing the formation of the inversion layer 18 even if a high potential difference is applied across an element, are, however, associated with the following problems if the methods are applied to a power IC having a plurality of elements formed on an SOI structure and separated by element isolation regions.

(a) If the first method, which changes the potential of the supporting substrate so as to follow the potential of the active layer in order not to generate a potential difference between the active layer in contact with the SOI insulating film and the supporting substrate, is applied to a power IC having a plurality of different type elements formed on the same supporting substrate, the independent operation of each element is lost and some practical problems occur in association with the mutually related operations of other elements on the same supporting substrate.

(b) The second method of using an extraordinary thick SOI insulating film has a practical problem of difficulty in obtaining an effective, sufficient thickness of the SOI insulating film. For example, in order to reduce the charge amount by 1/10, the oxide film is required to be ten times thicker. Heat treatment at a high temperature for a long period of time is required to obtain such a thick oxide film, and this heat treatment may cause crystal defects such as OSFs (Oxidation-induced Stacking Faults). In addition, a large stress is generated at an interface between the thick oxide film and semiconductor, and cracks are likely to be formed in the extraordinary thick oxide film. This method is therefore impractical.

SUMMARY OF THE INVENTION

It is therefore an object of the present invention to solve the above problems and ensure an independent and reliable operation of each of a plurality of elements of a power IC with an SOI structure separated by element isolation regions (e.g., trench element isolation regions), even if each element is applied with a high potential, or a high driving voltage and/or a high output voltage (the maximum operating voltage).

It is another object of the present invention to provide a power IC with an SOI structure capable of suppressing the generation of an inversion layer at the bottom of an active layer, lowering an on-resistance $R_{ON}$ of an output stage power-element, and operating at high speed with high efficiency.

In order to achieve the above objects, the invention features, as illustrated in FIGS. 7 to 9, in that a semiconductor device comprises; an SOI structure having at least five layers including a supporting substrate 11, a substrate insulating film 2a formed over the supporting substrate 11, an SOI conductive film 3 formed on and over the substrate insulating film 2a, an SOI insulating film 2b formed on and over the SOI conductive film 3, and a semiconductor layer (171, 172, ..., 174) formed over the SOI insulating film 2b; a first semiconductor element 54 formed in the semiconductor active layer 172 of the SOI structure; and a second semiconductor element 53 formed in the semiconductor active layer 171.

The SOI conductive film 3 may be made of impurity doped polysilicon (hereinafter called a "DOPOS"), refractory metal such as W, Mo, and Ti, refractory metal silicide such as $WSi_2$, $MoSi_2$, $TiSi_2$, or other low resistivity materials. The supporting substrate may be either of a p-type or an n-type.

A conventional SOI structure having a p-type supporting substrate 11, an SOI insulating film 12, and an n-type Si layer 17 is shown in FIG. 5A, and its equivalent circuit is shown in FIG. 5B. The n-type Si layer 17 is a semiconductor layer constituting an active layer in which desired semiconductor elements are formed. An electric capacitance of this SOI structure is represented by $C_{ox1}$ in FIG. 5B.

It is assumed here that the supporting substrate 11 is grounded and the n-type Si layer 17 is applied with a positive voltage (+V). When taking the equivalent circuit shown in FIG. 5B into consideration, it is known that electric charges of $-Q$, and $+Q$ ($Q=C_{ox1}\cdot V$) are induced in the order from the ground side to the positive voltage side. That is, at the bottom of the n-type Si layer 17 shown in FIG. 5A, an inversion layer made of $+Q$ charges is formed.

An SOI substrate of this invention made of a five-layer structure, including a p-type supporting substrate 11, a substrate insulating film 2a, an SOI conductive film 3, an SOI insulating film 2b, and an n-type Si layer 17, is shown in FIG. 6A, and its equivalent circuit is shown in FIG. 6B. Representing the electric capacitance of this SOI structure by $C_{total}$, representing the electric capacitance formed by the supporting substrate 11, substrate insulating film 2a, and SOI conductive film 3 by $C_{ox2}$, and by representing the electric capacitance formed by the SOI conductive film 3, SOI insulating film 2b, and n-type Si layer 17 by $C_{ox1}$ same as in FIG. 5B, then the following equation stands:

$$1/C_{total}=1/C_{ox1}+1/C_{ox2} \qquad (1)$$

which leads to:

$$C_{total}=[C_{ox2}/(C_{ox1}+C_{ox2})]\cdot C_{ox1}<C_{ox1} \qquad (2)$$

Similar to FIG. 5A, it is assumed that a positive voltage (+V) is applied to the n-type Si layer 17. Electric charges of $+Q'$ ($Q'=C_{total}\cdot V$) are induced in the bottom surface of the n-type Si layer 17 and an inversion layer is formed. Since the electric capacitance $C_{total}$ is smaller than $C_{ox1}$ of the SOI structure shown in FIGS. 5A and 5B, the induced electric charges are smaller and the inversion layer becomes hard to be formed.

Generally, in a power IC such as shown in FIGS. 7 to 9, an element isolation region 6 is formed between the first and second semiconductor elements 54 and 53. This element isolation region is preferably formed as shown in FIG. 9 by a trench extending from the surface of the active layer to the SOI conductive layer 2b, side wall insulating films 6a formed on only the side walls of the trench, and a trench conductive film 5 sandwiched between the side wall insulating films, embedded in the trench, and contacting the SOI conductive film 3. This trench conductive film 5 may be made of DOPOS, refractory metal, refractory metal silicide, or other materials. By electrically connecting the main electrode region of the first semiconductor element 54 to the trench conductive film 5 by a DOPOS layer or a surface metal wiring layer 772 such as aluminum (see, FIG. 8B), a potential difference between the semiconductor active layer 172 and the SOI conductive film 3 becomes small so that an inversion layer is suppressed from being formed at the bottom surface regions of the semiconductor active layers 171 and 172. The main electrode region of the first semiconductor element 54 means a source or drain region if the first semiconductor element is an FET or an SIT (Static Induction Transistor), or an emitter or collector region if the first semiconductor element is a bipolar transistor or an IGBT (Insulated Gate Bipolar Transistor). With the structures shown in FIGS. 8A, 8B and 9, the operation of the first semiconductor element 54 less affects the active layer 171 of the adjacent second semiconductor element 53. Therefore, a potential difference is suppressed from being formed in the active layer 171 and isolation between the first and second semiconductor elements 54 and 53 becomes good.

In this invention, if the SOI structure is made of a seven-layer structure such as shown in FIG. 10, additionally including a second SOI conductive film 3b and a second SOI insulating film 2c formed over the SOI insulating film (first SOI insulating film) 2b, the capacitance $C_{total}$ between a semiconductor active layer (171, 172) and a supporting substrate 11 can be further reduced. Therefore, even during a high voltage operation at several hundred V to one thousand V, generation of an inversion layer is suppressed and a suitable structure for large power ICs is provided. Obviously, a multi-layer structure having nine layers or more may also be used.

According to the invention, therefore, an increase in on-resistance $R_{ON}$ and a generation of leakage current between main electrode regions, both to be caused by an inversion layer at the bottom of the active layer, can be suppressed and the isolation characteristics of elements become good. Accordingly, the excellent circuit operation is possible at a higher driving voltage and a high speed power IC can be realized. At the same time, the on-resistance $R_{ON}$ of an output stage power switching element such as DMOS, IGBT, and SIT can be reduced, so that the conduction-loss is reduced and a power IC with high conversion efficiency can be realized.

Other and further objects and features of the present invention will become obvious upon an understanding of the illustrative embodiments about to be described in connection with the accompanying drawings or will be indicated in the appended claims, and various advantages not referred to therein will occur to one skilled in the art upon employing of the invention in practice.

BRIEF DESCRIPTION OF THE DRAWINGS

FIG. 5A is a cross sectional view showing a main part of a conventional SOI structure, and FIG. 5B is an equivalent circuit of the SOI structure shown in FIG. 5A.

FIG. 6A is a cross sectional view showing a main part of an SOI structure of this invention, and FIG. 6B is an equivalent circuit of the SOI structure shown in FIG. 6A.

FIG. 8B is a plan view showing a region near the high-side switch of the power IC of the second embodiment.

DETAILED DESCRIPTION OF THE EMBODIMENTS

Figure 1A:
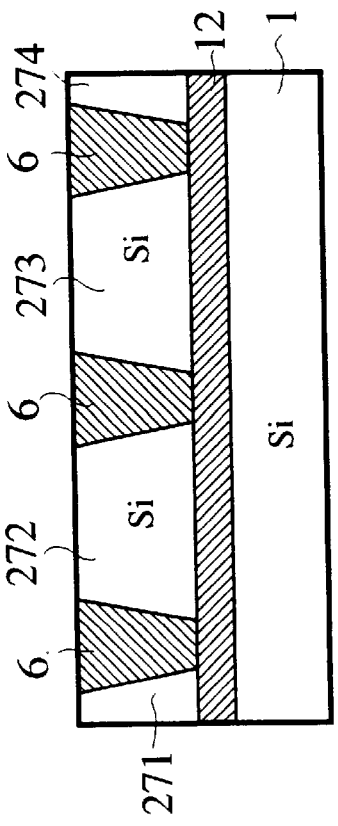
FIGS. 1A and 1B are schematic cross sectional views showing examples of conventional SOI structures.
Figure 1B:
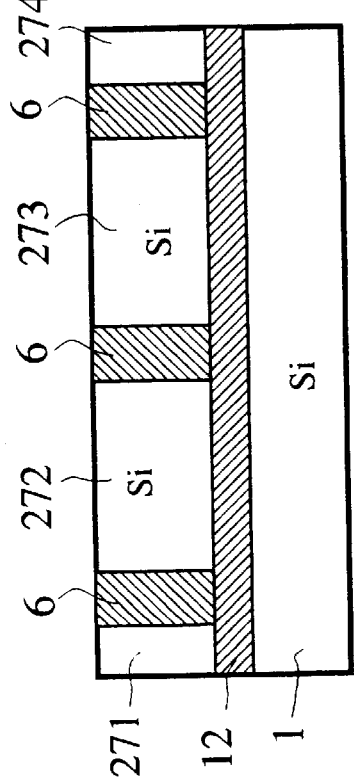
Figure 2:
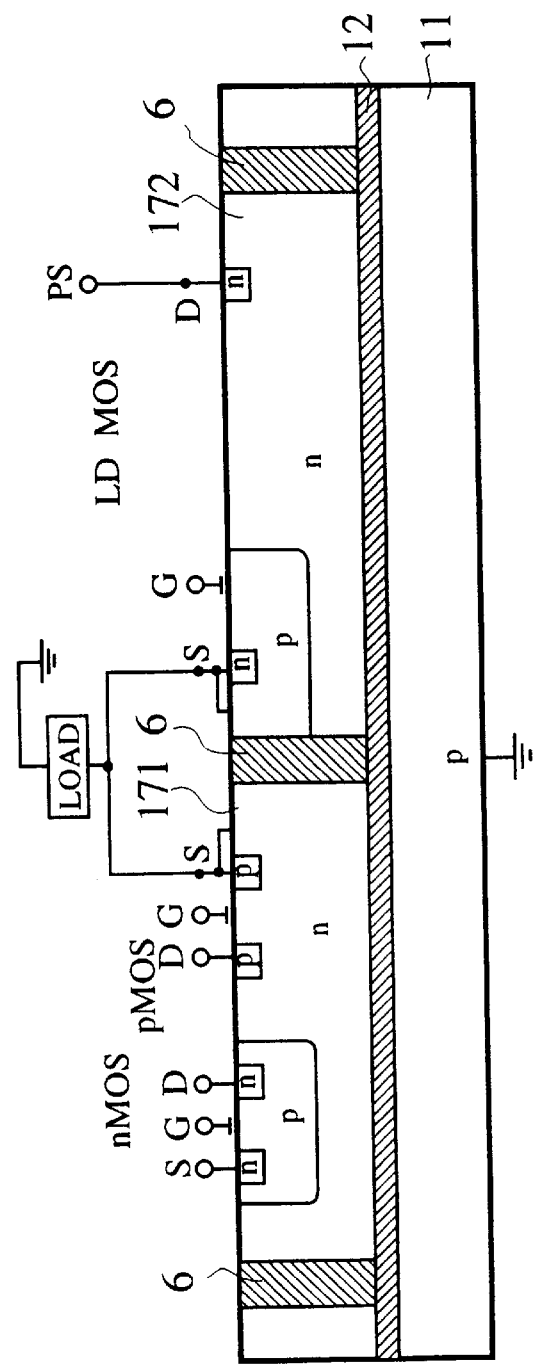
FIG. 2 is a schematic cross sectional view of a power IC having a CMOS and an n-channel LDMOS formed on a conventional SOI substrate.
Figure 3A:
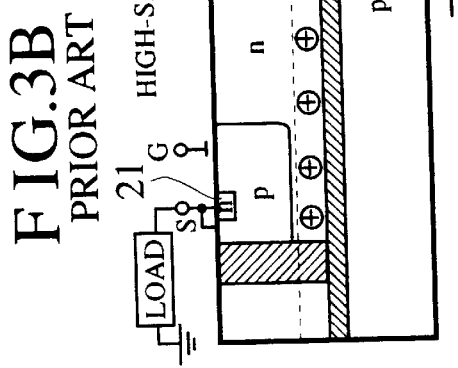
FIGS. 3A and 3B are schematic cross sectional views illustrating an on-state of an n-type LDMOS used as a low-and high-side switches, respectively.
Figure 3B:
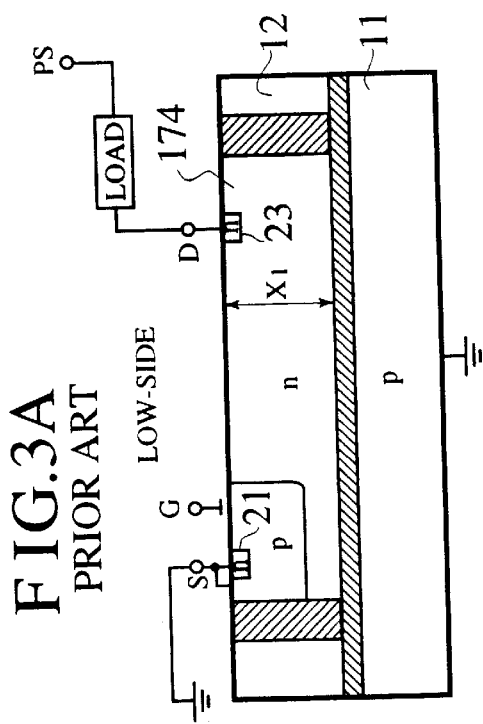
Figure 3C:
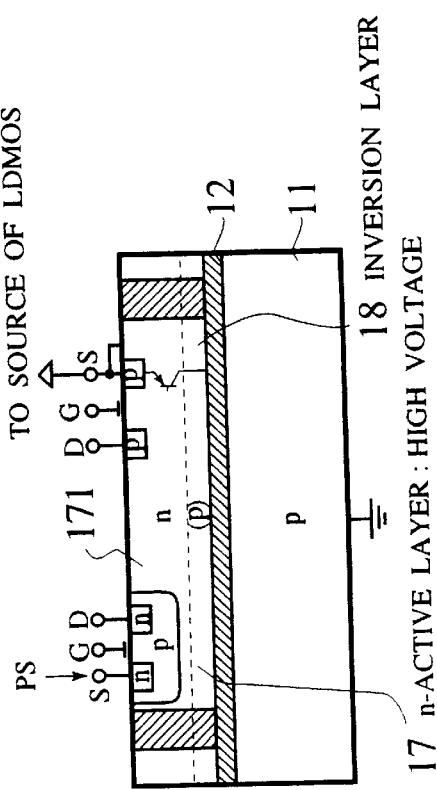
FIGS. 3C and 3D are schematic cross sectional views illustrating a control CMOS formed adjacent to the high-side switch, corresponding to the off- and on-states of the high-side switch, respectively.
Figure 3D:
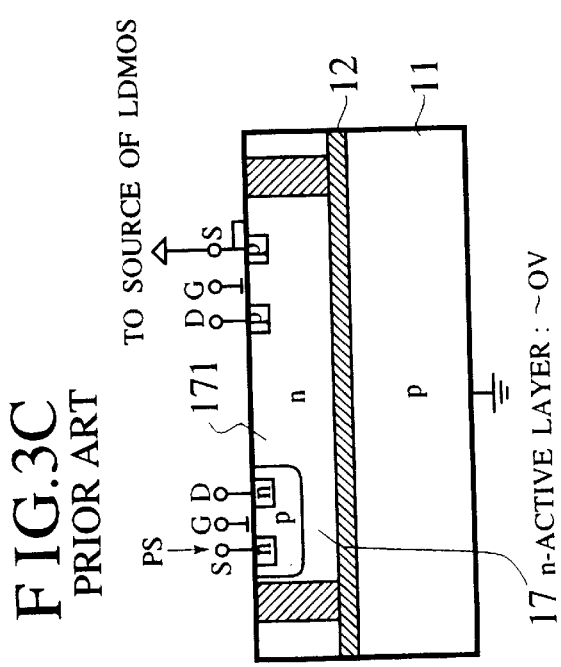
Figure 4A:
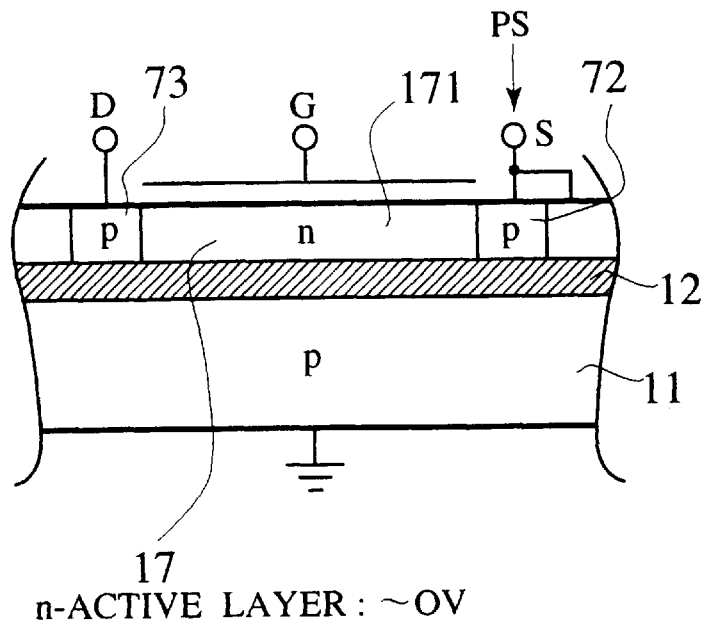
FIGS. 4A and 4B are schematic cross sectional views illustrating the influence of the potential of a thin active layer of a CMOS.
Figure 4B:
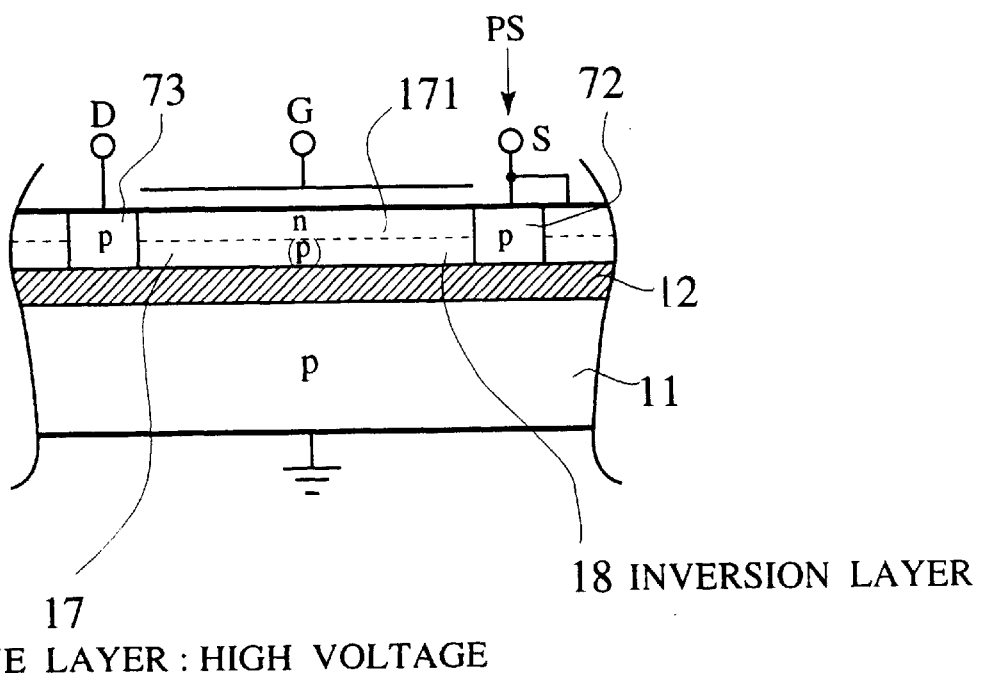

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

(1st Embodiment)

Figure 7:
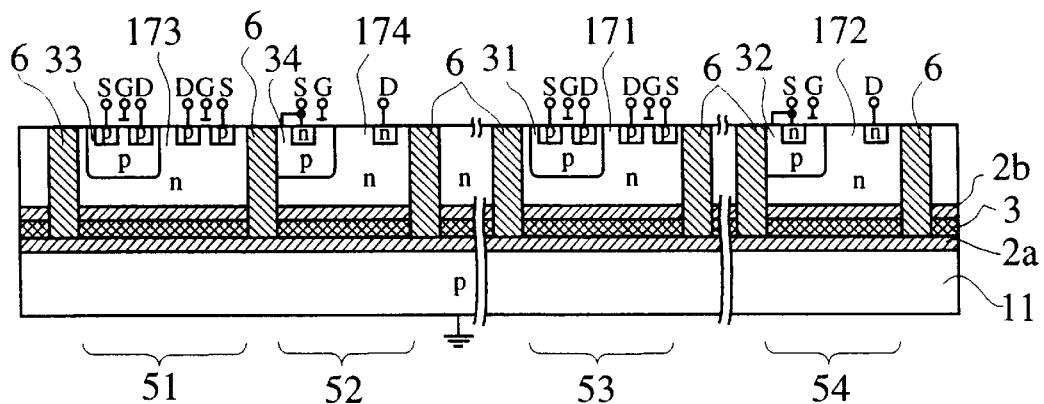
FIG. 7 is a schematic cross sectional view of a power IC having an SOI structure according to a first embodiment of the invention.

FIG. 7 is a schematic cross sectional view of a power IC according to the first embodiment of the invention. In the first embodiment of the invention, an SOI structure is a five-layer structure, including from the lowest layer a p-type supporting substrate 11, an Si oxide film 2a, an impurity doped polysilicon film (hereinafter called a "DOPOS film") 3 serving as an SOI conductive film, an Si oxide film 2b, and an n-type Si film (171, 172, 173, 174, . . . ). In the n-type active layer 173 formed by the n-type Si film of the SOI structure at the highest layer, a low-side control circuit 51 is formed, in the n-type active layer 174 a low-side output DMOS 52 is formed, in the n-type active layer 171 a high-side control circuit 53 is formed, and in the n-type active layer 172 a high-side output DMOS54 is formed. Between respective n-type active layers 171, 172, 173, 174, . . . element isolation regions 6 are formed extending from the substrate surface, or the top surface of the n-type Si film (171, 172, . . . ), down to the DOPOS film 3. Each element isolation region 6 is constituted by a trench extending from the substrate surface down to the DOPOS film 3, trench side wall insulating films formed on the side walls of the trench, and a high resistivity polycrystalline Si film filled in between the trench side wall insulating films. Although the trench side wall insulating films are omitted in FIG. 7, the element isolation region 6 is a multi-layer dielectric isolation region having the polycrystalline Si film and trench side wall insulating films.

Also, in FIG. 7 the source S of the PMOS transistor of the high-side control circuit 53 is connected to the source S of the high-side output circuit 54, and also to a load (LOAD). The drain region D of the high-side output circuit 54 is connected to a power supply PS1.

According to the first embodiment of the invention, since an SOI oxide film capacitor with a capacitance $C_{ox1}$ formed by the n-type active layer (171, 172, 173, 174, . . . ), Si oxide film 2b, and DOPOS film 3 is serially connected to a substrate oxide film capacitor with a capacitance $C_{ox2}$ formed by the DOPOS film 3, Si oxide film 2a, and supporting substrate 11, the total capacitance $C_{total}$ of the SOI structure becomes small as indicated by the equations (1) and (2) above. Therefore, even if a high voltage is applied to elements, an inversion layer is prevented from being induced at the bottom of each active layer of the element.

Unless otherwise specified in the following description, the Si oxide film 2a in contact with the supporting substrate 11 is called "a substrate oxide film", and the oxide film 2b in contact with the upper layer Si films 171, 172, 173, 174, . . . is called "an SOI oxide film". In place of the substrate oxide film 2a and SOI oxide film 2b, other insulating films such as $Sl_3N_4$ films, $Al_2O_3$ films, and SiON films may also be used, and these insulating films are collectively called "a substrate insulating film" 2a and "an SOI insulting film" 2b.

The SOI structure shown in FIG. 7 may be formed through SDB (Silicon Direct Bonding) method, a combination of SDB method and SIMOX (Separation by IMplanted OXygen) method, or epitaxial growth method. The thicknesses of the substrate oxide film 2a and SOI oxide film 2b formed through SDB method are preferably about 0.5 to 3 μm. With SDB method, the SOI structure is formed, for example, by the following processes.

(a) As the supporting substrate 11, a p-type silicon substrate is used which has an impurity concentration of about $5 \times 10^{12} cm^{-3}$ to $1 \times 10^{16} cm^{-3}$ and a thickness of 250 to 600 μm. On the surface of the supporting substrate 11, the substrate oxide film 2a having a thickness of 0.5 to 2 μm is formed. The DOPOS film 3 is formed thereon through CVD to a thickness of 0.5 to 3 μm. On the DOPOS film 3, the SOI oxide film 2b is formed through CVD or the like to a thickness of 1 to 3 μm and the surface thereof is polished to have a mirror surface.

(b) Next, an n-type substrate (171, 172, 173, 174, ...) for the semiconductor active layer having a mirror-polished bottom surface (a mirror surface) is prepared. And the supporting substrate 11 and the n-type substrate (171, 172, ...) are mated with facing the mirror surface to the mirror surface and annealed at 900° C. for 1hr. Alternatively, another SOI oxide (bottom SOI oxide) film is formed on the bottom of the n-type substrate (171, 172, 173, 174, ...), and after the surface of the bottom SOI oxide film on the bottom of the semiconductor active layer is mirror-polished, this mirror surface is bonded to the mirror surface of the SOI oxide film 2b of the supporting substrate 11. In stead of the above annealing, an anode bonding SDB method may be used in which heat treatment is performed while applying a voltage. After bonding by SDB, the n-type substrate (171, 172, 173, 174, ...) is thinned by grinding, or lapped and polished to a desired thickness, e.g., 1 to 5 μm.

(c) Thereafter, the n-type substrate (171, 172, 173, 174, ...) is selectively etched by the photolithography technique and RIE, microwave plasma etching, ECR etching, or other etching method, using $CF_4+O_2$, $SF_6+O_2$, $SF_6+H_2$, $CCl_4$, or $SiCl_4$, and in succession the SOI oxide film 2b and DOPOS film 3 are selectively etched to form trenches.

(d) Next, the trench side wall insulating films (oxide films) are formed on the inner walls of the trenches and thereafter, the trenches are buried with non-doped polysilicon (hereinafter called "NDPOS") or oxygen doped polysilicon (Semi-Insulating Poly-Silicon, hereinafter called "SIPOS") through CVD, to thus form the dielectric isolation region as the element isolation regions 6.

(e) Thereafter, DMOSs 52 and 54, CMOSs 51 and 53, and other necessary elements are formed by standard MOS processes, the details thereof being omitted.

As described above, according to the first embodiment of this invention, the isolation state of island active layers is remarkably good and independence of each element is ensured. Therefore, the excellent performance inherent to each element can be realized. Furthermore, a high driving voltage can be used and a high speed operation becomes possible. At the same time, an inversion layer is suppressed from being formed at the bottom of the active layer in which an output DMOS is formed, and an on-resistance $R_{ON}$ does not increases. Accordingly, a high efficiency power IC can be realized which has very small conduction-loss of an output power element.

(2nd Embodiment)

Figure 8A:
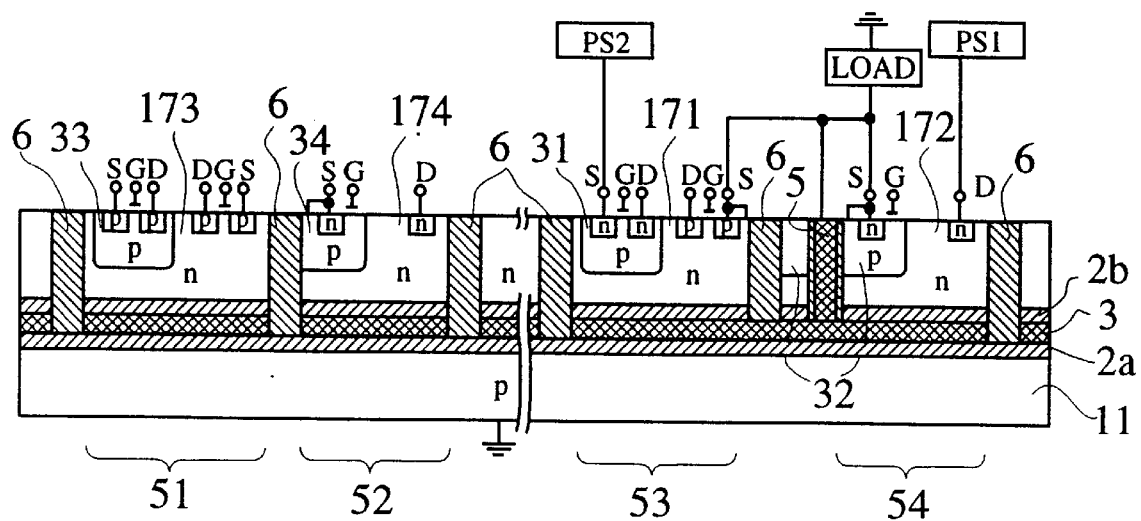
FIG. 8A is a schematic cross sectional view of a power IC according to a second embodiment of the invention.

FIG. 8A is a schematic cross sectional view of a power IC according to the second embodiment of the invention, and FIG. 8B is a corresponding plan view showing the interconnection on the active layer. Although the second embodiment has the fundamental structure same as the power IC of the first embodiment, the second embodiment differs from the first embodiment in that the source of a DMOS used as a high-side output element is connected to, and made equipotential with, a DOPOS film 3 as the SOI conductive film in contact with the SOI oxide film just under the output-DMOS.

Specifically, the second embodiment of the invention has a five-layer SOI structure including from the lowest layer a p-type supporting substrate 11, a substrate oxide film (substrate insulating film) 2a, a DOPOS film 3 serving as the SOI conductive film, an SOI oxide film (SOI insulating film) 2b, and an n-type Si film (171, 172, 173, 174, ...) serving as the semiconductor active layer. In the n-type active layer 173 formed by the n-type Si film, a low-side control circuit 51 is formed, in the n-type active layer 174 a low-side output-DMOS 52 is formed, in the n-type active layer 171 a high-side control circuit 53 is formed, and in the n-type active layer 172 a high-side output DMOS 54 is formed. Between respective n-type active layers 171, 172, 173, 174, ... element isolation regions 6 are formed extending from the substrate surface down to the DOPOS film 3. Each element isolation region 6 or the dielectric isolation region 6 is constituted by a trench extending from the substrate surface down to the DOPOS film 3, trench side wall insulating films formed on the side walls of the trench, and an NDPOS film or SIPOS film filled in between the trench side wall insulating films. Like FIG. 7, the trench side wall insulating films are omitted for convenience' sake in FIG. 8A.

In addition to the element isolation regions 6 shown in FIG. 8A, a wiring trench is formed. Specifically, the p-type active region (p-base) 32 of the high-side output DMOS 54, n-type active layer 172, and SOI oxide film 2b are selectively and anisotropically etched to form a trench (wiring trench).. Thereafter, trench side wall insulating films 6a are formed on the side walls of the wiring trench, reaching the DOPOS film 3. Then, a conductive film (trench conductive film) 5 is formed burying the wiring trench. As shown by the plan view in FIG. 8B, the trench conductive film 5 and the source of the high-side output DMOS 54 are electrically connected by an electrical interconnection layer 772 from a DOPOS film, a refractory metal film, or the conventional wiring metal film such as Al film formed on the top surface of the n-type active layer 172. The element isolation region 6 between the high-side output-DMOS 54 and the high-side control CMOS 53 for controlling the output-DMOS 54 is made shallower than other element isolation regions so as not to penetrate through the DOPOS film 3 but to stop at the bottom of the SOI oxide film 2b. With this arrangement, the source potential of the high-side output-DMOS 54 and the DOPOS film 3 under the high-side control CMOS 53 and the high-side output-DMOS 54 become equipotential.

According to the second embodiment of the invention, since an SOI oxide film capacitor with a capacitance $C_{ox1}$ formed by the n-type active layer (171, 172, 173, 174, ...), SOI oxide film 2b, and DOPOS film 3 is serially connected to a substrate oxide film capacitor with a capacitance $C_{ox2}$ formed by the DOPOS film 3, substrate oxide film 2a, and supporting substrate 11, the total capacitance $C_{total}$ of the SOI structure becomes small, similar to the first embodiment. In addition to this effect, since the DOPOS film 3 just under the control CMOS 53 (and the output-DMOS 54) and the source of the high-side output DMOS 54 are equipotential, an inversion layer is prevented from being induced in the n-type active layer 172 and also in the n-type active layer 171 on the SOI oxide film 2b side.

The power IC of the second embodiment of the invention can be manufactured by SDB method similar to the first embodiment. Specifically, the supporting substrate 11 and the n-type substrate (171, 172, 173, 174, . . . ) are bonded together by SDB method and the n-type substrate is adjusted to a desired thickness. These processes are similar to the first embodiment. Thereafter, p-wells 31 and 33, p-bases 32 and 34 are formed in the n-type substrate (171, 172, 173, 174, . . . ). The p-base 32 between the high-side output DMOS 54 and high-side control circuit 53 and the n-type substrate 172 are selectively etched by photolithography technique and RIE, microwave plasma etching, ECR etching, or other etching method, using $CF_4+O_2$, $SF_6+O_2$, $SF_6+H_2$, $CCl_4$, or $SiCl_4$, and in succession the SOI oxide film 2b is selectively etched to form the wiring trench. Next, side wall insulating films (oxide films) are formed on the inner walls of the wiring trench. The oxide film on the bottom of the wiring trench is removed through a high-directional etching such as RIE method using $CF_4+H_2$, leaving the trench side wall oxide films 37 only on the wiring trench side walls. Thereafter, DOPOS or refractory metal such as W, Mo, and Ti is filled in the wiring trench by selective CVD to form the trench conductive film 5.

Thereafter, similar to the wiring trench, RIE method or other processes are performed to form element isolation trenches by etching the n-type substrate 173, 174, and 171 in which the low-side control circuit 51, low-side output DMOS 52, and high-side control circuit 53 are to be formed. After the element isolation trench between the high-side control circuit 53 and high-side output DMOS is coated with photoresist or the like, the bottoms of the other element isolation trenches not covered by the photoresist or the like are further etched down to the Si oxide film 2b and DOPOS film 3. Thereafter, the cover of photoresist or the like on the high-side element isolation trench is removed. And trench side wall insulating films on the inner walls of all the element isolation trenches are formed, and the insides of the element isolation trenches are buried with the insulating or semi-insulating film such as such as NDPOS and SIPOS to complete the power IC shown in FIG. 8A.

Figure 9:
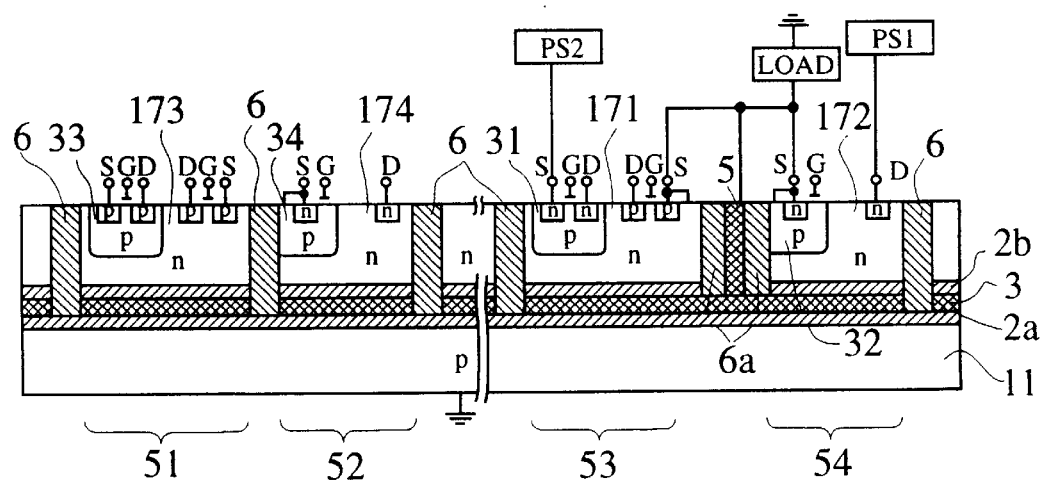
FIG. 9 is a schematic cross sectional view of a power IC modified from the second embodiment, with interconnection to a power supply and the like being shown.

The second embodiment of the invention is not limited only to the structure shown in FIGS. 8A and 8B. For example, as shown in FIG. 9, the source of the high-side output DMOS and the DOPOS film 3 just under elements may be connected by using a trench element isolation region 6 between the high-side output DMOS 54 and high-side CMOS 53. In other words, a wiring trench and an element isolation trench may be made integrally. In this case, in order not to lower the element isolation function, the insulating films 6a covering the trench side walls are made thick and the resistivity of the trench conductive film 5 such as DOPOS and refractory metal between the insulating films 6a is required to be sufficiently low.

For the convenience of description, pMOS and nMOS of the high-side control CMOS 53 are called a high-side pMOS and a high-side nMOS in the following.

As shown in FIGS. 8A and 9, the power IC of the second embodiment of the invention operates under the condition that the source of the high-side output DMOS 54 and the source of the high-side pMOS are connected in order to allow the high-side CMOS 53 to control the potential of the source of the high-side DMOS 54 relative to the drain thereof. In this case, the drain of the high-side output DMOS is connected to a power supply (PS1) of +5V potential and the source of the high-side nMOS is also connected to another power supply (PS2) having this potential (+5V). The source of the high-side pMOS is also connected to the n-type active layer 171.

For example, consider the case wherein the source of the high-side output-DMOS 54 is grounded via a load, the drain thereof is applied with a high potential (+5V), and the high-side output-DMOS 54 turns on. In this case, the source potential of the output-DMOS 54 rises. Conventionally in the prior art, a potential difference was generated between the n-type active layer 171 of the high-side pMOS and the p-type substrate and an inversion layer is formed in the bottom of the active layer neighboring the SOI substrate. In contrast, in the second embodiment of this invention, a potential difference is hardly generated. It is therefore possible to prevent the inversion layer to be induced in the bottom of the active layer 171 for the high-side CMOS 53.

In addition to this operation, the structure of the second embodiment of this invention provides the operation similar to the first embodiment of the invention. Accordingly, even if a potential higher than the first embodiment is applied across the high-side output DMOS 54, induction of the inversion layer can be avoided in the high-side output DMOS 54 and high-side control CMOS 53, and the operation characteristics can be improved with higher power handling capability (such as the higher maximum operating voltage).

The structure of the second embodiment of the invention is not limited to only to that shown in FIGS. 8A and 8B or in FIG. 9. The embodiment provides advantageous effects even if it is applied to a power IC having a more general SOI structure of the type that the potential of an active layer of an element B adjacent to an element A isolated by an element isolation region, changes with an operation of the element A. In other words, the wiring structure shown in FIGS. 8A and 8B or in FIG. 9 is not limited but other structures are possible on the assumption that the first active layer as the operation basis of the element A is electrically connected to the SOI conductive film (such as the DOPOS film) 3 just under the SOI insulating film 2b in contact with the bottom of the second active layer in which the element B adjacent to the element A is formed.

Also in this case, it is preferable that the trench element isolation region 6 between the elements A and B as between the active regions 171 and 172 in FIG. 8A does not penetrate through the SOI conductive film 3 so as to make the SOI conductive film 3 under the SOI insulating film 2b of the element A equipotential with the SOI conductive film 3 under the element B. The element A is not limited to LDMOS shown in FIG. 8A, but an IGBT, bipolar transistor, SIT, SI thyristor (SITH), and the like may be used. The element B may be a bipolar transistor, Bi-CMOS, SIT, or the like. Even with a combination of these two or more elements, the on-resistance $R_{ON}$ of an output power-element lowers and a high speed operation is possible. Still further, a driving voltage for a control element and for an output stage element can be raised, a high transconductance $g_m$ can be easily obtained, and a high speed operation is possible. Accordingly, a high efficiency power IC can be realized which has lower conduction-loss of an output power-element.

(3rd Embodiment)

Figure 10:
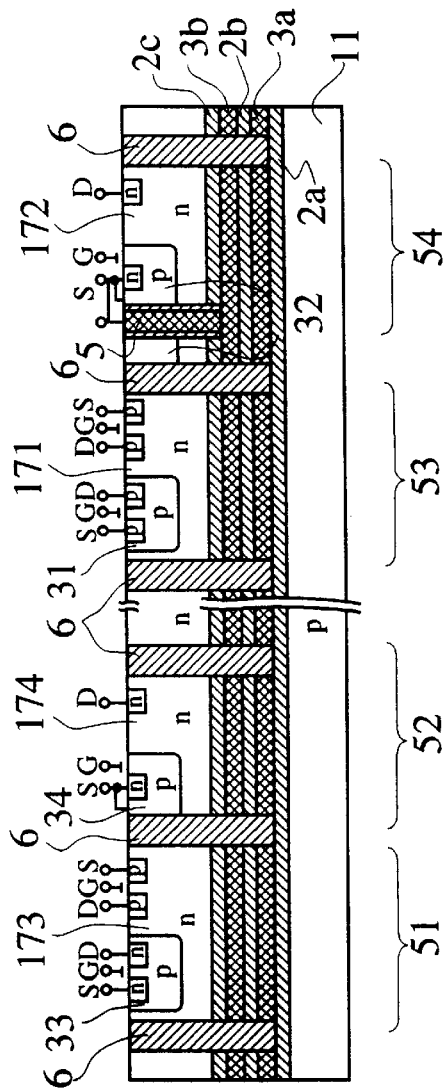
FIG. 10 is a schematic cross sectional view of a power IC according to a third embodiment of the invention.

FIG. 10 shows the structure of a power IC in cross section according to a third embodiment of the invention. The power IC of the third embodiment of the invention has a seven-layer SOI structure including from the lowest layer a p-type supporting substrate 11, a substrate oxide film (a substrate insulating film) 2a, a first DOPOS film 3a serving as a first SOI conductive film, a first SOI oxide film (a first SOI insulating film) 2b, a second DOPOS film 3b serving as a second SOI conductive film, a second SOI oxide film (a second SOI insulating film) 2c, and an n-type Si film (171, 172, 173, 174, . . . ) serving as a semiconductor active layer. In the n-type active layer 173 on the second SOI oxide film 2c, a low-side control circuit 51 is formed, in the n-type active layer 174 a low-side output-DMOS 52 is formed, in the n-type active layer 171 a high-side control circuit 53 is formed, and in the n-type active layer 172 a high-side output DMOS 54 is formed. Between respective n-type active layers 171, 172, 173, 174, . . . dielectric isolation regions serving as element isolation regions 6 are formed extending from the substrate surface down to the DOPOS film 3a. Each element isolation region 6 is constituted by a trench extending from the substrate surface down to the DOPOS film 3a, trench side wall insulating films formed on the side walls of the trench, and an NDPOS film or SIPOS film filled in between the trench side wall insulating films. Like FIG. 7, the trench side wall insulating films are omitted for convenience' sake in FIG. 10. A nine-layer structure may be used by additionally forming a third DOPOS film (a third SOI conductive film) and a third SOI oxide film (a third SOI insulating film) on the second SOI oxide film 2c, or an eleven-layer structure may be used. As the number of layers is made larger, the capacitance between the active layer and supporting substrate becomes smaller and an inversion layer is prevented from being induced.

In addition to the element isolation trenches shown in FIG. 10, the p-base 32, n-type active layer 172, and second SOI oxide film 2c in the high-side output-DMOS 54 are selectively and anisotropically etched to form a wiring trench, and trench side wall insulating films are formed on the side walls of the wiring trench. A conductive film (trench conductive film) 5 made of DOPOS, refractory metal, metal silicide, or the like is filled in the wiring trench between the side wall insulating films, the trench conducting film 5 contacting the second DOPOS film 3b. The trench conductive film 5 and the source of the high-side output-DMOS 54 are connected by a surface wiring such as a DOPOS film and a metal film (by the similar way shown in FIG. 8B). The element isolation region 6 between the high-side output-DMOS 54 and its high-side control CMOS 53 may not penetrate into the second DOPOS film 3b to make equipotential the second DOPOS films 3b under the high-side output DMOS 54 and under the high-side control CMOS 53.

For a power IC operating at a lower maximum operating voltage, the wiring trench and trench conductive film 5 may be omitted.

In any case, for such a multi-layer structure, the trench element isolation region 6 of the SOI substrate is required at least to penetrate through the n-type Si film (171, 172, 173, 174, . . . ) as the semiconductor active layer and the second SOI oxide film 2c and to contact the second DOPOS film 3b on the second SOI oxide film 2c. However, if the operation of an element formed in the island between the trench element isolation regions 6 and the substrate potential just under the element are desired to be independent, it is preferable that the element isolation trench extends from the surface of the Si film (171, 172,173, 174, . . . ) down through the first DOPOS film 3a and contacts the substrate oxide film 2a.

Also, in FIG. 10 the source S of the PMOS transistor of the high-side control circuit 53 is connected to the source S of the high-side output circuit 54, and also to a load (LOAD). The drain region D of the high-side output circuit 54 is connected to a power supply PS1.

(4th Embodiment)

Figure 11:
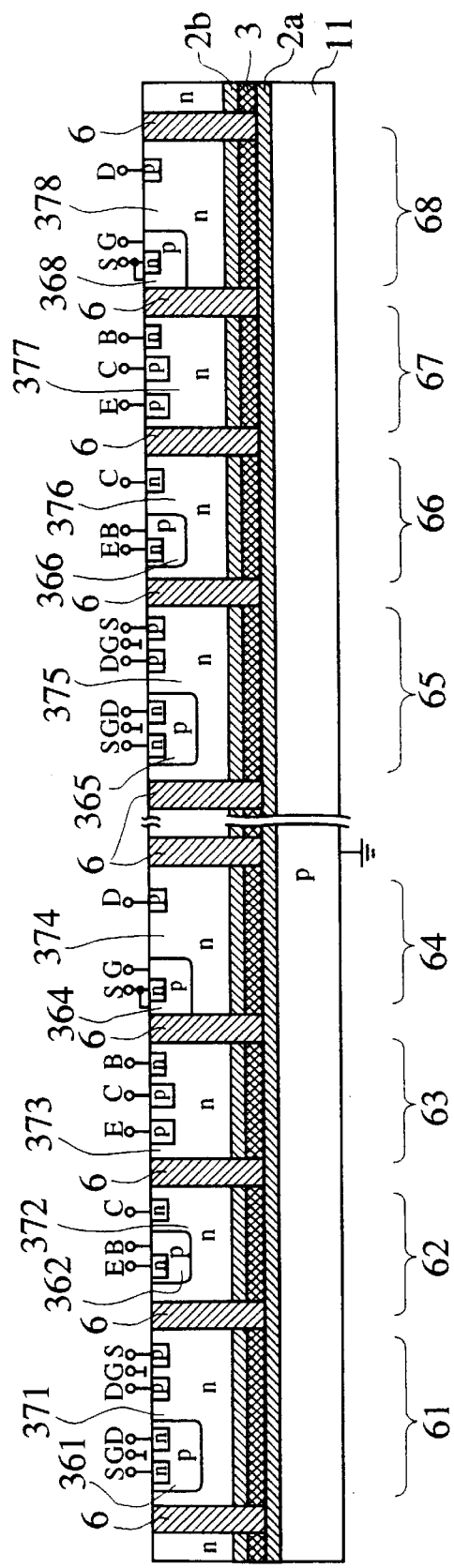
FIG. 11 is a schematic cross sectional view of a power IC according to a fourth embodiment of the invention.

FIG. 11 shows a power IC using an IGBT as an output stage and a Bi-CMOS circuit as a control circuit, according to the fourth embodiment of the invention. The power IC of the fourth embodiment of the invention has an SOI structure of a five-layer structure, including from the lowest layer a p-type supporting substrate 11, a substrate oxide film 2a as a substrate insulating film, a DOPOS film 3 as the SOI conductive film, an SOI oxide film 2b as an SOI insulating film, and an n-type Si film (371, 372, . . . , 377, 378, . . . ) as a semiconductor active layer. The n-type Si film is separated into n-type Si film islands (371, 372, . . . , 377, 378, . . . by dielectric isolation region 6 serving as element isolation regions 6 each made of: a trench, which extends from the surface of the n-type Si film down through the SOI oxide film 2b and DOPOS film 3 and reaches the substrate oxide film 2a; trench side wall insulating films formed on the side wall of the trench; and an NDPOS film or the like filled in the trench sandwiched by the side wall insulating films. In the n-type active layer island 371, a low-side control CMOS 61 is formed, in the island 372, a low-side control npn bipolar transistor 62 with a p-base 362 is formed, in the island 373, a low-side control pnp bipolar transistor 63 is formed, and in the island 374, a low-side output-IGBT 64 with a p-base 364 is formed. In the island 375, a p-well 365 is formed. An nMOS in this p-well 365 and a PMOS in the island 375 constitute a high-side control CMOS 65. In the island 376, a high-side control npn bipolar transistor 66 is formed, in the island 377, a high-side control pnp bipolar transistor 67 is formed, and in the island 378, a high-side output-IGBT 68 is formed.

Also, in FIG. 11 the source S of the PMOS transistor of the high-side control CMOS 65 and he source of the high-side output DMOS 68 are connected to a load (LOAD), and the drain D of this DMOS 68 is connected to a power supply PS1.

According to the fourth embodiment of the invention, since an SOI oxide film capacitor with a capacitance $C_{ox1}$ formed by the n-type Si film (371, 372, 373, . . . , 378, 379, . . . ), Si oxide film 2b, and DOPOS film 3 is serially connected to a substrate oxide film capacitor with a capacitance $C_{ox2}$ formed by the DOPOS film 3, substrate oxide film 2a, and supporting substrate 11, the total capacitance $C_{total}$ of the SOI structure becomes small. Hence, an inversion layer is prevented from being induced at the bottom of each n-type active layer 371, 372, . . . , 379, . . . Therefore, according to the fourth embodiment of the invention, a high blocking voltage with lower on-resistance $R_{ON}$ of the output-IGBT is obtained and a high speed, high efficiency power IC can be provided. Obviously, instead of the low-side output-IGBT and high side output-IGBT used in this embodiment, n-channel DMOSs may be used.

According to the fourth embodiment of the invention, the potential change at the output stage can be prevented from affecting the high-side control pnp bipolar transistor 67 and low-side control pnp transistor 63 adjacent to the high-side output-IGBT 68 and low-side output-IGBT 64. Accordingly, not only the isolation characteristics of each element become good, but also each element can be driven at a high voltage and operated at high speed, and very high blocking voltage for the output-IGBT is provided.

(5th Embodiment)

Figure 12:
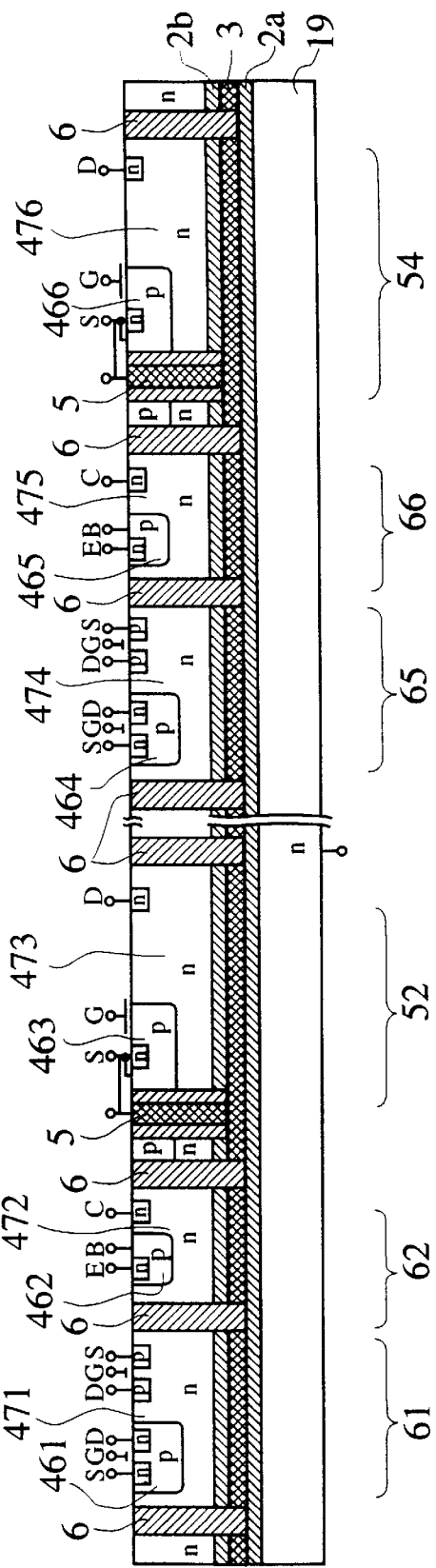
FIG. 12 is a schematic cross sectional view of a power IC according to a fifth embodiment of the invention.

The supporting substrate used for the SOI structure of this invention is not limited to a p-type substrate as of the first to fourth embodiments, but an n-type substrate may also be used as the supporting substrate. FIG. 12 is a cross sectional view of a power IC using an n-type substrate as the supporting substrate, according to the fifth embodiment of the invention. As shown in FIG. 12, the power IC of the fifth embodiment of the invention has an SOI structure of a five-layer structure, including from the lowest layer an n-type supporting substrate 19, a substrate oxide film 2a as the substrate insulating film, a DOPOS film 3 as the SOI conductive film, an SOI oxide film 2b as the SOI insulating film, and an n-type Si film (471, 472, . . . , 476, . . . ) as the semiconductor active layer. The n-type Si film is separated into n-type Si film islands 471, 472, . . . , 476, . . . by element isolation regions 6 each made of: an element separation trench, which extends from the surface of the n-type Si film down through the n-type Si film, SOI oxide film 2b, and DOPOS film 3 and reaches the substrate oxide film 2a; trench side wall insulating films formed on the inner walls of the element isolation trench; and an NDPOS film filled in the element isolation trench.

In the n-type active layer 471 separated into an island by the element isolation regions 6, a p-well 461 is formed, and an nMOS formed in this p-well 461 and a pMOS formed in the n-type active layer 471 constitute a low-side control CMOS 61. In the n-type active layer 472, a low-side control npn bipolar transistor 62 with a p-base 462 is formed, and in the n-type active layer 473, a low-side output-DMOS 52 with a p-base 463 is formed. An nMOS formed in a p-well 464 in the n-type active layer 474 and a pMOS formed in the n-type active layer 474 constitute a high-side control CMOS 65, in the n-type active layer 475, a high-side control npn bipolar transistor 66 with a p-base 465 is formed, and in the n-type active layer 476, a high-side output-DMOS 54 with a p-base 466 is formed. A wiring trench is formed penetrating through the n-type active layer 473 and p-base 463 and reaching the DOPOS film 3, trench side wall insulating films are formed on the inner walls of the wiring trench, and a trench conductive film 5 of DOPOS, refractory metal, or the like is formed between the trench side wall insulating films. The trench conductive film 5 and the source of the low-side output-DMOS are electrically connected by a surface DOPOS wiring or a surface metal wiring, for the connection of the source to the DOPOS film 3. Similarly, a wiring trench is formed penetrating through the p-base 466 and n-type active layer 476 and reaching the DOPOS film 3. With the trench conductive film 5 formed in the wiring trench and a surface wiring (not shown) above the n-type active layer 476, the potentials of the DOPOS film 3 and the high-side output DMOS are made equal.

Also, in FIG. 12, the source S of the PMOS of the high-side control 65 is connected to the source S of high-side output-DMOS 54 and to a load (LOAD), and a power supply PS1 is connected to the drain D of the high-side output-DMOS 54.

According to the structure of the fifth embodiment of the invention, there is almost no potential difference among the sources of the low-side output-DMOS and high-side output-DMOS and the DOPOS films 3 under the n-type active layers 473 and 476. Furthermore, since an SOI oxide film capacitor with a capacitance $C_{ox1}$ formed by the n-type Si film (471, 472, . . . , 476, . . . ), Si oxide film 2b, and DOPOS film 3 is serially connected to a substrate oxide film capacitor with a capacitance $C_{ox2}$ formed by the DOPOS film 3, substrate oxide film 2a, and supporting substrate 11, the total capacitance $C_{total}$ of the SOI structure becomes small and an inversion layer is prevented from being induced at the bottom of each n-type active layer. Therefore, according to the fifth embodiment of the invention, an on-resistance $R_{ON}$ of the low- and high-side output-DMOSs lowers, a high transconductance $g_m$ can be achieved, and a high speed operation with a high driving voltage for each element become possible. Isolation between the output-DMOSs 52 and 54 operating at a higher maximum operating voltage and adjacent control circuits 62 and 66 is good, so that the performance inherent to each element constituting the power IC can fully be presented. It is therefore possible to realize a high speed, high efficiency power IC.

Figure 13:
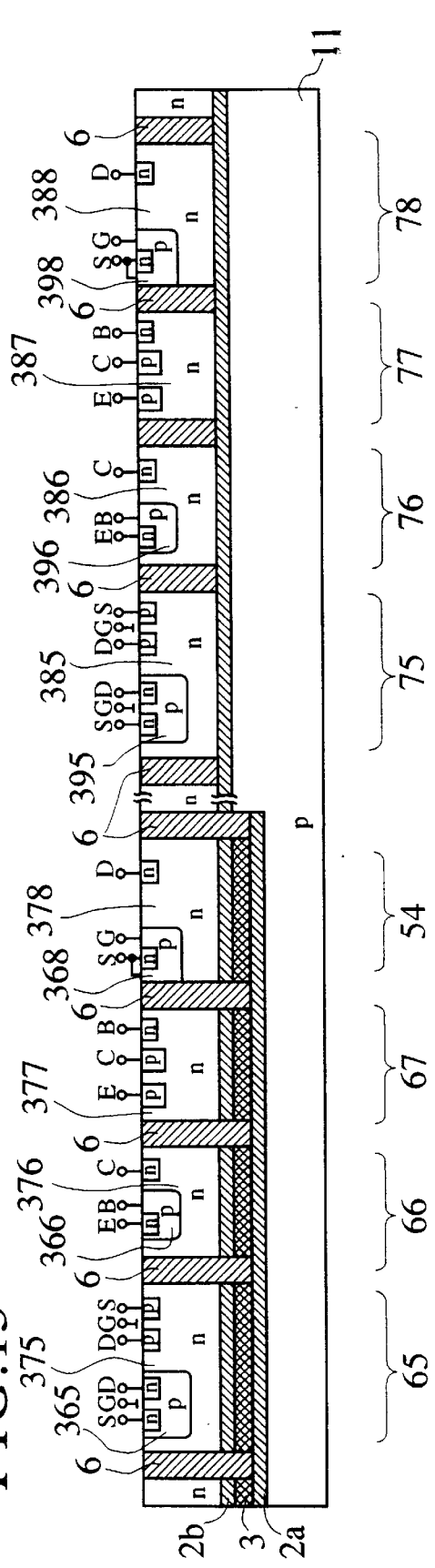
FIG. 13 is a schematic cross sectional view showing an application example of embodiments of the invention.

Various modifications will become possible for those skilled in the art after receiving the teachings of the present disclosure without departing from the scope thereof. For example, a combination of structures of the above embodiments may be used or the structure of the invention may be applied partially to a conventional power IC. FIG. 13 shows an example of a power IC in which the low-side circuits have conventional structures and only the high-side circuits use those of the fourth embodiments of the invention. Specifically, the power IC shown in FIG. 13 has an SOI structure of a five-layer structure, including from the lowest layer a p-type supporting substrate 11, a substrate oxide film 2a, a DOPOS film 3, an SOI oxide film 2b, and an n-type Si film (375, 376, 377, 378, . . . ). The n-type Si film is separated into n-type Si film islands (n-type active layers) 375, 376, 377, 378, . . . by element isolation regions 6 each made of: a trench, which extends from the surface of the n-type Si film down through the SOI oxide film 2b and DOPOS film 3 and reaches the substrate oxide film 2a; trench side wall insulating films formed on the inner walls of the trench; and an NDPOS film filled in between the walls. In the island 375, a p-well 365 and a high-side control CMOS 65 are formed, in the island 376, a high-side control npn bipolar transistor 66 is formed in the island 377, a high-side control pnp bipolar transistor 67 is formed, and in the island 378, a high-side output-DMOS 54 is formed.

On the side of the low-side circuits, a conventional SOI structure is used which is a three-layer structure, including from the lowest layer the p-type supporting substrate 11, SOI oxide film 2b, and an n-type Si film (385, 386, 387, 388, . . . ). The n-type Si film is separated into n-type Si active layer islands 385, 386, 387, 388, . . . like the high-side circuits by element isolation regions 6 extending from the surface of the n-type Si film down to the SOI oxide film 2b. In a p-well 395 in the island 385, an nMOS is formed which together with a pMOS in the island 385 constitutes a low-side control CMOS 75. In the islands 386 and 387, a low-side control npn bipolar transistor 76 and a low-side control pnp bipolar transistor 77 are formed, respectively. In the island 388, a low-side output-DMOS 78 with a p-base 398 is formed. Also with this structure, an inversion layer is prevented from being formed at the bottom of each active layer of a high-side output-DMOS or the like applied with a high voltage, isolation characteristics between adjacent active layers are improved, and a low on-resistance $R_{ON}$ and a high speed operation become possible, similar to the first to fifth embodiments.

Also, in FIG. 13, the source S of the PMOS transistor of the high-side control CMOS 65 is connected to the source S of high-side output-DMOS 54 and to a load (LOAD), and a power supply PS1 is connected to the drain D of the high-side output-DMOS 54.

In the first to fifth embodiments, although the dielectric isolation (DI) structure having the dielectric isolation regions is used for the element isolation regions 6, a junction isolation (JI) structure having p-type regions as the isolation regions for the n-type active region or a self-isolation structure without the element isolation region may also be used. Furthermore, it is apparent from the foregoing description that the structure of the invention may be applied to a discrete power device in place of an IC.

As described earlier, instead of Si oxide of the substrate oxide film 2a and SOI oxide films 2b and 2c, other insulating films made of, for example, $Si_3N_4$, SiON, $Al_2O_3$, PSG, BPSG, NDPOS and SIPOS may be used.

Still further, instead of the DOPOS film, the SOI conductive film 3 may be made of other conductive films, preferable low resistivity conductive films, such as impurity doped single crystal Si, refractory metal such as W, Mo, Ti, and Co, silicide of these metals ($WSi_2$, $MoSi_2$, $TiSi_2$, and $CoSi_2$). Obviously, the conductivity type of the structure of each embodiment may be inverted, i.e., an n-type is changed to a p-type and vice versa.

What is claimed is:

1. A semiconductor device comprising:
   a high-side output element comprising a first main electrode region connected to a high potential power source and a second main electrode region connected to a load;
   a high-side control circuit connected to the high-side output element;
   a low-side output element;
   a low-side control circuit neighboring the low-side output element;
   a grounded supporting substrate supporting said high-side output element and said high-side control circuit;
   a flat substrate insulating film formed on said supporting substrate;
   a first flat conductive film formed on and contacted with said flat substrate insulating film;
   a first flat insulating film formed on and contacted with said first flat conductive film;
   a first semiconductor active layer formed above said first flat insulating film, said first semiconductor active layer including the high-side output element;
   a second semiconductor active layer formed above said first flat insulating film, said second semiconductor active layer including the high-side control circuit; and
   a dielectric isolation region formed between the first and second semiconductor active layers.

2. A device of claim 1, wherein said dielectric isolation region reaches from a top surface of the first semiconductor active layer to a bottom surface of said first flat insulating film.

3. A device of claim 1, wherein said dielectric isolation region comprises a trench extending from a top surface of said first semiconductor active layer to said first flat conductive film, side wall insulating films formed only on the side walls of said trench, and a trench conductive film filled in a part of said trench sandwiched by said side wall insulating films and reaching said first flat conductive film.

4. A device of claim 3, further comprising an electrical interconnection layer formed on the top surface of said first semiconductor active layer for interconnecting said trench conductive film and the second main electrode region of said high-side output element.

5. A device of claim 3, wherein said high-side control circuit includes a CMOS circuit comprising:
   a pMOS comprising:
      a source region connected to the trench conductive film and the second main electrode region of said high-side output element, and
      a drain region; and
   an nMOS comprising:
      a source region connected to a power source, and
      a drain region.

6. A device of claim 1, further comprising a wiring trench formed between said high-side output element and high-side control circuit and spaced apart from said dielectric isolation region.

7. A device of claim 6, wherein:
   said high-side output element has a base region of a conductivity type opposite to a conductivity type of said first semiconductor active layer,
   said wiring trench is formed extending from a surface of said base region and penetrating through said base region and said first semiconductor active layer,
   said second main electrode region has the same conductivity type as said first semiconductor active layer, and
   said second main electrode region is formed in said base region.

8. A device of claim 7, further comprising:
   a side wall insulating film formed only on a side wall of said wiring trench; and
   a trench conductive film embedded in said wiring trench and having a side surface surrounded by the side wall insulating film.

9. A device of claim 8, further comprising an electrical interconnection layer formed on a top surface of said first semiconductor active layer for interconnecting said trench conductive film and the second main electrode region of said high-side output element.

10. A device of claim 8, wherein said high-side control circuit includes a CMOS circuit comprising:
    a pMOS comprising:
       a source region connected to the trench conductive film and the second main electrode region of said high-side output element, and
       a drain region; and
    an nMOS comprising:
       a source region connected to a power source, and
       a drain region.

11. A device of claim 6, further comprising:
    a side wall insulating film formed only on a side wall of said wiring trench; and
    a trench conductive film embedded in said wiring trench and having a side surface surrounded by the side wall insulating film.

12. A device of claim 11, further comprising an electrical interconnection layer formed on a top surface of said first semiconductor active layer for interconnecting said trench conductive film and the second main electrode region of said high-side output element.

13. A device of claim 11, wherein said high-side control circuit includes a CMOS circuit comprising:
    a pMOS comprising:
       a source region connected to the trench conductive film and the second main electrode region of said high-side output element, and
       a drain region; and
    an nMOS comprising:
       a source region connected to a power source, and
       a drain region.

14. A device of claim 1, wherein said high-side control circuit includes a CMOS circuit comprising:
    a pMOS comprising:
       a source region connected to the second main electrode region of said high-side output element, and
       a drain region; and
    an nMOS comprising:
       a source region connected to a power source, and
       a drain region.

15. In a semiconductor device comprising a high-side output element comprising a first main electrode region connected to a power source and a second main electrode region connected to a load, a high-side control circuit connected to the high-side output element, a low-side output element, a low-side control circuit neighboring the low-side output element, a supporting substrate biased to a predetermined voltage and supporting said high-side output element and said high-side control circuit, and a substrate insulating film formed on said supporting substrate, the improvement comprising:

first and second conductive films formed on and contacted with said substrate insulating film, the first conductive film being electrically isolated from the second conductive film;

first and second insulating films formed on and contacted with said first and second conductive films, respectively;

a first semiconductor active layer formed above said first insulating film, said first semiconductor active layer including the high-side output element;

a second semiconductor active layer formed above said second insulating film, said second semiconductor active layer including the high-side control circuit; and a dielectric isolation region formed between said first and second semiconductor active layers.

16. In a semiconductor device comprising a high-side output element comprising a first main electrode region connected to a power source and a second main electrode region connected to a load, a high-side control circuit connected to the high-side output element, a low-side output element, a low-side control circuit neighboring the low-side output element, a grounded supporting substrate supporting said high-side output element and said high-side control circuit, the improvement comprising:

a flat substrate insulating film formed on said supporting substrate;

a first flat conductive film formed on and contacted with said flat substrate insulating film;

a first flat insulating film formed on and contacted with said first flat conductive film;

a first semiconductor active layer formed above said first flat insulating film, said first semiconductor active layer including the high-side output element;

a second semiconductor active layer formed above said first flat insulating film, said second semiconductor active layer including the high-side control circuit; and a dielectric isolation region formed between the first and second semiconductor active layers, wherein said dielectric isolation region reaches from a top surface of the first semiconductor active layer to said flat substrate insulating film.

17. In a semiconductor device comprising a high-side output element comprising a first main electrode region connected to a power source and a second main electrode region connected to a load, a high-side control circuit connected to the high-side output element, a low-side output element, a low-side control circuit neighboring the low-side output element, a grounded supporting substrate supporting said high-side output element and said high-side control circuit, the improvement comprising:

a flat substrate insulating film formed on said supporting substrate;

a first flat conductive film formed on and contacted with said flat substrate insulating film;

a first flat insulating film formed on and contacted with said first flat conductive film;

first, second, third and fourth semiconductor active layers formed above said first flat insulating film, wherein a first dielectric isolation region is formed between said second and third semiconductor active layers and a second dielectric isolation region is formed between said third and fourth semiconductor active layers, and wherein said first, second, third and fourth semiconductor active layers include the high-side output element, the high-side control circuit, the low-side output element and the low-side control circuit, respectively.

18. A device of claim 17, further comprising:

a second flat conductive film formed on and contacted with said first flat insulating film; and a second flat insulating film formed above said second flat conductive film and under said first, second, third and fourth semiconductor active layers.

19. A device of claim 18, wherein a third dielectric isolation region reaches from a top surface of said first semiconductor active layer to said substrate insulating film.

20. A device of claim 18, further comprising:

a wiring trench extending from a top surface of said first semiconductor active layer to said second flat conductive film;

a side wall insulating film formed only on a side wall of said wiring trench; and a trench conductive film filled in said wiring trench, surrounded by said side wall insulating film, and reaching said second flat conductive film.

21. A device of claim 20, further comprising an electrical interconnection layer formed on the top surface of said first semiconductor active layer for interconnecting said trench conductive film and the second main electrode region of said high-side output element.

22. A device of claim 17, further comprising a first wiring trench reaching from a top surface of said first semiconductor active layer to said first flat conductive film.

23. A device of claim 22, further comprising a second wiring trench reaching from a top surface of said third semiconductor active layer to said first flat conductive film.

24. In a semiconductor device comprising a high-side output element comprising a first main electrode region connected to a power source and a second main electrode region connected to a load, a high-side control circuit connected to the high-side output element, a low-side output element, a low-side control circuit neighboring the low-side output element, a supporting substrate supporting said high-side output element and said high-side control circuit, the improvement comprising:

a flat substrate insulating film formed on said supporting substrate;

a first flat conductive film formed on and contacted with said flat substrate insulating film;

a first flat insulating film formed on and contacted with said first flat conductive film;

a second flat conductive film formed on and contacted with said first flat insulating film; and a second flat insulating film formed above said second flat conductive film;

first and second semiconductor active layers formed above said second flat insulating film;

a first dielectric isolation region formed between said first and second semiconductor active layers, wherein said first and second semiconductor active layers include the high-side output element and the high-side control circuit, respectively.

25. A device of claim 24, wherein said dielectric isolation region reaches from a top surface of said first semiconductor active layer to said substrate insulating film.

26. A device of claim 24, further comprising:
a wiring trench extending from a top surface of said first semiconductor active layer to said second flat conductive film;
a side wall insulating film formed only on a side wall of said wiring trench; and
a trench conductive film filled in said wiring trench, surrounded by said side wall insulating film, and reaching said second flat conductive film.

27. A device of claim 26, further comprising an electrical interconnection layer formed on the top surface of said first semiconductor active layer for interconnecting said trench conductive film and the second main electrode region of said high-side output element.

28. A device of claim 15, further comprising:
a wiring trench reaching from a top surface of said first semiconductor active layer to said first conductive film;
a side wall insulating film formed only on a side wall of said wiring trench;
a trench conductive film embedded in said wiring trench and having a side surface surrounded by the side wall insulating film; and
an electrical interconnection layer formed on a top surface of said first semiconductor active layer for interconnecting said trench conductive film and the second main electrode region of said high-side output element.

29. In a semiconductor device comprising a high-side output element comprising a first main electrode region connected to a power source and a second main electrode region connected to a load, a high-side control circuit connected to the high-side output element, a low-side output element, a low-side control circuit neighboring the low-side output element, a supporting substrate supporting said high-side output element and said high-side control circuit, the improvement comprising:
a flat substrate insulating film formed on said supporting substrate;
a first flat conductive film formed on and contacted with said flat substrate insulating film;
a first flat insulating film formed on and contacted with said first flat conductive film;
first and second semiconductor active layers formed above said first flat insulating film;
a first dielectric isolation region formed between said first and second semiconductor active layers,
wherein said first and second semiconductor active layers include the high-side output element and the high-side control circuit, respectively, and wherein a conductivity type of said first semiconductor active layer is the same as a conductivity type of said supporting substrate.

30. In a semiconductor device comprising a high-side output element comprising a first main electrode region connected to a power source and a second main electrode region connected to a load, a high-side control circuit connected to the high-side output element, a low-side output element, a low-side control circuit neighboring the low-side output element, a supporting substrate supporting said high-side output element and said high-side control circuit, the improvement comprising:
a flat substrate insulating film formed on said supporting substrate;
a first flat conductive film formed on and contacted with said flat substrate insulating film;
a first flat insulating film formed on and contacted with said first flat conductive film;
first and second semiconductor active layers formed above said first flat insulating film; and
a first dielectric isolation region formed between said first and second semiconductor active layers,
wherein said first and second semiconductor active layers include the high-side output element and the high-side control circuit, respectively, and wherein a conductivity type of said first semiconductor active layer is opposite to a conductivity type of said supporting substrate.

* * * * *